(12) United States Patent
Choi

(10) Patent No.: US 9,626,063 B2
(45) Date of Patent: Apr. 18, 2017

(54) FLEXIBLE ORGANIC LIGHT EMITTING DISPLAY DEVICE AND METHOD FOR PRODUCING THE SAME

(71) Applicant: LG Display Co., Ltd., Seoul (KR)

(72) Inventor: BongKi Choi, Gyeonggi-do (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 14/838,596

(22) Filed: Aug. 28, 2015

(65) Prior Publication Data

US 2016/0062520 A1    Mar. 3, 2016

(30) Foreign Application Priority Data

Aug. 29, 2014   (KR) .......................... 10-2014-0114179

(51) Int. Cl.
| | | |
|---|---|---|
| *G06F 3/047* | (2006.01) | |
| *G06F 3/041* | (2006.01) | |
| *H01L 27/32* | (2006.01) | |
| *G06F 3/044* | (2006.01) | |
| *G09G 5/00* | (2006.01) | |
| *H01L 51/52* | (2006.01) | |

(Continued)

(52) U.S. Cl.
CPC .............. *G06F 3/047* (2013.01); *G06F 3/044* (2013.01); *G06F 3/0412* (2013.01); *G09G 5/003* (2013.01); *H01L 27/323* (2013.01); *H01L 27/3248* (2013.01); *H01L 27/3276* (2013.01); *H01L 51/5246* (2013.01); *H01L 51/56* (2013.01); *G06F 2203/04102* (2013.01); *G09G 2300/0426* (2013.01); *G09G 2380/02* (2013.01); *H01L 51/0097* (2013.01); *H01L 2227/323* (2013.01); *H01L 2251/5338* (2013.01)

(58) Field of Classification Search
None
See application file for complete search history.

(56) References Cited

U.S. PATENT DOCUMENTS

2010/0265188 A1   10/2010   Chang et al.
2014/0014960 A1   1/2014   Yamazaki et al.
(Continued)

FOREIGN PATENT DOCUMENTS

EP    2698821 A2    2/2014

OTHER PUBLICATIONS

European Search Report issued in corresponding European Patent Application No. 15182874.6 dated Jan. 26, 2016.

*Primary Examiner* — David D Davis
(74) *Attorney, Agent, or Firm* — Morgan, Lewis & Bockius LLP

(57) ABSTRACT

A flexible organic light emitting display device is provided. The flexible organic light emitting display device comprises a first flexible substrate and a second flexible substrate spaced apart from the first flexible substrate, a first touch line unit connected with a first pad unit on the first flexible substrate at the peripheral area, a second touch line unit connected with a second pad unit on the second flexible substrate at the peripheral area and a gap balancing conductive element included in a conductive adhesive layer configured to electrically connect the first pad unit and the second pad unit for maintaining a second gap on the basis of a first gap. The first flexible substrate and the second flexible substrate are configured to have the first gap at a display area and the second gap at a peripheral area surrounding the display area.

14 Claims, 11 Drawing Sheets

(51) Int. Cl.
*H01L 51/56* (2006.01)
*H01L 51/00* (2006.01)

(56) References Cited

U.S. PATENT DOCUMENTS

| | | | | |
|---|---|---|---|---|
| 2014/0042398 A1* | 2/2014 | Choi | ................... | H01L 27/3244 257/40 |
| 2014/0078077 A1* | 3/2014 | Choi | ..................... | H01L 27/323 345/173 |
| 2014/0078701 A1 | 3/2014 | Tanabe et al. | | |
| 2014/0184937 A1* | 7/2014 | Lim | ..................... | H01L 27/323 349/12 |

* cited by examiner

FLEXIBLE ORGANIC LIGHT EMITTING DISPLAY DEVICE AND METHOD FOR PRODUCING THE SAME

CROSS-REFERENCE TO RELATED APPLICATIONS

This application claims the priority of Korean Patent Application No. 10-2014-0114179 filed on Aug. 29, 2014, in the Korean Intellectual Property Office, the disclosure of which is incorporated herein by reference.

BACKGROUND OF THE INVENTION

Field of the Invention

The present invention relates to an organic light emitting display device, and more particularly to an in-cell type touch panel integrated flexible organic light emitting display device.

Description of the Related Art

The field of display devices for visually displaying electrical information signals has grown rapidly. Thus, studies for developing performance such as thinning, weight lightening, and low power consumption, of various display devices have continued. Representative examples of the display devices include a Liquid Crystal Display (LCD) device, a Plasma Display Panel (PDP) device, a Field Emission Display (FED) device, an Electro-Wetting Display (EWD) device, an Organic Light Emitting Display (OLED) device, and the like.

In particular, the organic light emitting display device is a self-light emitting display device that does not need an additional light source unlike a liquid crystal display. Thus, the organic light emitting display device can be manufactured into a lightweight and thin form. Further, the organic light emitting display device is advantageous in terms of power consumption since it is driven with a low voltage. Also, the organic light emitting display device has a fast response speed, a wide viewing angle, and an infinite contrast ratio. Therefore, the organic light emitting display device has been recognized as a next-generation display device. However, in spite of such advantages, the organic light emitting display device has a disadvantage of being particularly vulnerable to moisture and oxygen. Thus, there is a problem in obtaining the reliability as compared with the other display devices.

The organic light emitting display device displays images using an organic light emitting element as a self-light emitting element. The organic light emitting display device includes a plurality of pixels formed of organic light emitting elements. The organic light emitting element includes a first electrode (e.g., anode), an organic light emission layer, a second electrode (e.g., cathode), and a bank. The organic light emission layer formed of an organic substance and configured to generate electro luminescence on the basis of an electrical signal applied between the first electrode and the second electrode is disposed between the first electrode and the second electrode. A plurality of organic light emitting elements is separated by the bank.

If the organic light emitting display device is of a top-emission type, the first electrode has reflective characteristics and the second electrode has transparent characteristics or translucent characteristics in order to emit a light emitted from the organic light emission layer in an upward direction. Further, in order to secure the reliability, a transparent encapsulation part configured to protect the organic light emitting element against oxygen and moisture is formed on the organic light emitting element.

Such an organic light emitting display device may further include a touch panel (or other type of touch user interface). Generally, a touch panel includes an add-on type touch panel attached to an external surface of an organic light emitting display device, an on-cell type touch panel disposed on an organic light emitting display device, and an in-cell type touch panel integrated within an organic light emitting display device. In the in-cell type touch panel integrated organic light emitting display device, a touch panel is integrated. Thus, it can be realized in a thin form as compared with the add-on type or on-cell type organic light emitting display device.

In recent years, a flexible organic light emitting display device (F-OLED) capable of maintaining a display performance even if bent like paper has been developed. It is to be substituted for nonflexible display devices using a flexible substrate formed of a flexible material, such as plastic, metal or a flexible glass. Such a flexible substrate is applied to a display device that has an excellent durability and the substrate cannot be easily broken. Meanwhile, various technologies for integrating a touch panel in such display devices have been under research. In particular, if overall thickness of a display device is increased due to an attached touch panel, the flexibility of a flexible organic light emitting display device is decreased. Therefore, technologies capable of realizing an excellent touch performance while minimizing an increase in thickness are needed.

SUMMARY OF THE INVENTION

Accordingly, the present invention is directed to a flexible organic light emitting display device that substantially obviates one or more of the problems due to limitations and disadvantages of the related art.

An object of the present invention is to provide a flexible organic light emitting display device which can avoid problems of delamination and cracks of a pad unit that is laminated to a flexible organic light emitting display device when a touch panel is integrated.

Another object of the present invention is to provide a flexible organic light emitting display device including a pad unit which is configured to improve a stress durability generated at the pad unit with minimized thickness in order to solve a pad delamination defect.

Another object of the present invention is to provide a flexible organic light emitting display device including a line unit which is configured to improve a line break durability caused by a conductive ball. The conductive ball at the line unit is connected with a pad unit when it is used for bonding.

Another object of the present invention is to provide a flexible organic light emitting display device configured to achieve both excellent flexibility and touch sensitivity simultaneously with minimized thickness and also minimize physical stress in a pad unit.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a flexible organic light emitting display device comprises a first flexible substrate and a second flexible substrate spaced apart from the first flexible substrate, the first flexible substrate and the second flexible substrate configured to have a first gap at a display area and a second gap at a peripheral area surrounding the display area, a first touch line unit connected with a first pad unit on the first flexible substrate at the peripheral area, a second touch line unit connected with a second pad unit on the second flexible substrate at the peripheral area; and a gap balancing conductive element included in a conductive adhesive layer configured to electrically connect the first pad unit and the second pad unit for maintaining the second gap on the basis of the first gap.

To achieve these and other advantages and in accordance with the purpose of the present invention, as embodied and broadly described, a method for producing a flexible organic light emitting display device comprising the steps: providing a first flexible substrate having a first touch line unit connected with a first pad unit on the first flexible substrate at the peripheral area; providing a second flexible substrate having a second touch line unit connected with a second pad unit on the second flexible substrate at the peripheral area; bonding the first flexible substrate to the second flexible substrate using a conductive adhesive layer, wherein a gap balancing conductive element is included in the conductive adhesive layer to electrically connect the first pad unit and the second pad unit, wherein the first flexible substrate and the second flexible substrate have a first gap at a display area and a second gap at a peripheral area surrounding the display area It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Figure 1A:
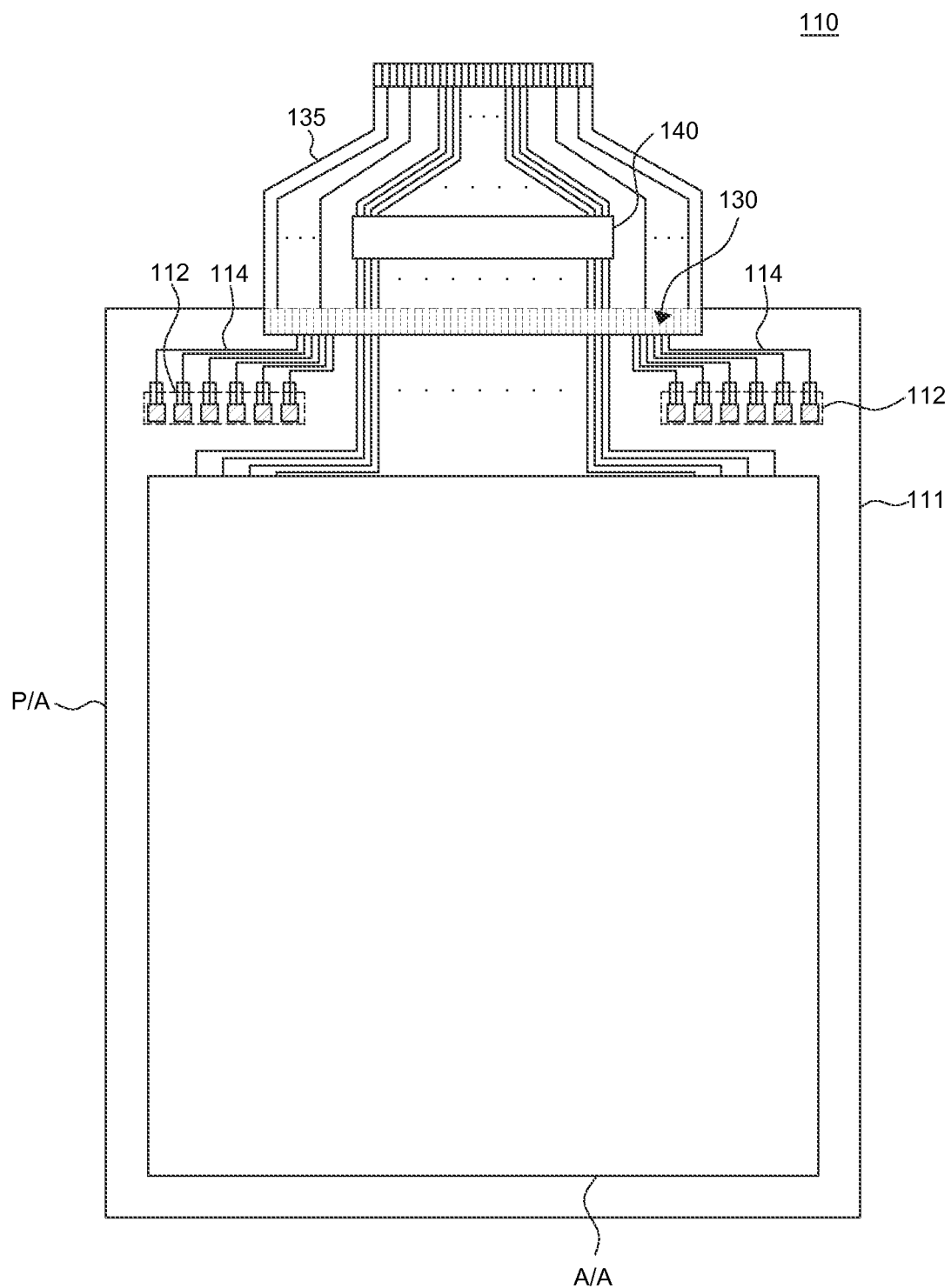
FIG. 1A to FIG. 1C are schematic plan views of a flexible organic light emitting display device according to an exemplary embodiment of the present disclosure.

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the invention, and the present disclosure will be defined by the appended claims.

The shapes, sizes, ratios, angles, numbers, and the like illustrated in the accompanying drawings for describing the exemplary embodiments of the present disclosure are merely examples, and the present disclosure is not limited thereto. Further, in the following description, a detailed explanation of known related technologies may be omitted to avoid unnecessarily obscuring the subject matter of the present disclosure. The terms such as "comprising", "including," "having," and "consist of" used herein are generally intended to allow other elements to be added unless the terms are used with the term "only". Any references to singular may include plural unless expressly stated otherwise.

Elements are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is referred to as being "on" another element or layer, it may be directly on the other element or layer, or intervening elements or layers may be present.

Although the terms "first", "second", and the like are used for describing various elements, these elements are not confined by these terms. These terms are merely used for distinguishing one element from the other elements. Therefore, a first element to be mentioned below may be a second element in a technical concept of the present disclosure.

Throughout the whole disclosure, the same reference numerals denote the same elements.

Since size and thickness of each element illustrated in the drawings are represented merely for convenience in explanation, the present disclosure is not necessarily limited to the illustrated size and thickness of each element.

The features of various embodiments of the present disclosure can be partially or entirely bonded to or combined with each other and can be interlocked and operated in technically various ways as can be fully understood by a person having ordinary skill in the art, and the embodiments can be carried out independently of or in association with each other.

The inventors of the present disclosure have continued research and development for commercialization of a top-emission type touch panel integrated flexible organic light emitting display device having an excellent flexibility, while being lightweight and thin in form. To be specific, in a top-emission type touch panel integrated flexible organic light emitting display device, a second electrode transmits a light emitted from an organic light emission layer. In particular, since the second electrode is formed of a metal material, if a touch panel is provided under the second electrode, the second electrode shields an electrostatic capacitive touch signal. Therefore, a touch panel in a top-emission flexible organic light emitting display device has been limited to be provided on a second electrode.

Further, the inventors of the present disclosure recognize that the organic light emission layer may be damaged at a high temperature of about 110° C. or more. Furthermore, generally, the deposition temperature required for forming a touch electrode of a touch panel is high enough to damage the organic light emission layer. Therefore, there has been technical limitation in providing a touch panel on an organic light emission layer.

In order to solve the above-described problems, the inventors of the present disclosure provided an organic light emitting display panel on a first flexible substrate and separately provided a touch panel on a second flexible substrate. Further, the inventors of the present disclosure bonded the first flexible substrate to the second flexible substrate using a transparent adhesive layer. In particular, according to such a touch panel integrated type, an organic light emission layer is not damaged at a high temperature.

In order to drive the above-described top-emission type touch panel integrated flexible organic light emitting display device, the inventors of the present disclosure provided a first pad unit on the first flexible substrate and a second pad unit on the second flexible substrate. Further, the inventors of the present disclosure formed a line so as to electrically connect the first pad unit with a touch driver circuit. Furthermore, the inventors of the present disclosure formed a line so as to electrically connect the second pad unit with a touch electrode. Then, the inventors of the present disclosure electrically connected the second flexible substrate with the first flexible substrate using a conductive ball. Such a touch panel integrated type has an advantage of being light and thin, but there are some problems with the pad unit due to an in-cell type structure.

Firstly, the pad units respectively formed on the first flexible substrate and the second flexible substrate are exposed to the outside. Thus, moisture permeates into the exposed area or a pad delamination defect occurs while the conductive ball is separated from the pad units due to a stress caused by bending.

Secondly, line units connected with the pad units respectively formed on the first flexible substrate and the second flexible substrate are cut or broken by the conductive ball when the first flexible substrate and the second flexible substrate are bonded to each other.

Thirdly, if a gap between the first flexible substrate and the second flexible substrate is too short, the flexibility can be improved. But a parasitic capacitance is increased, which causes a decrease in touch sensitivity. On the other hand, if the gap is too long, the parasitic capacitance is decreased and the touch sensitivity is improved. But a degree of exposure of the pad unit is increased, which deteriorates the pad delamination defect and reduces the flexibility.

Particularly, the above-described problems are independent from each other and also intimately connected with each other. For example, if the gap is increased, the parasitic capacitance of the touch panel is decreased, but the pad delamination defect and the line break caused by the conductive ball are increased. The term "line break" refers to an electrical signal line such as the first touch line unit 114 or the second touch line unit 124 that is cut or broken in two by a conductive ball. If a signal line is disconnected in any such manner, then electrical signal cannot be transmitted thereby. Also, the ability to bend or flex deteriorates. On the other hand, if the gap is decreased, the parasitic capacitance is increased and problems occur with respect to touch sensitivity. Thus, there are difficulties in application of the touch panel to a display panel.

Hereinafter, an in-cell type touch panel integrated flexible organic light emitting display device of top-emission type having bendability according to an exemplary embodiments of the present disclosure will be briefly described with reference to FIG. 1A to FIG. 1D.

Hereinafter, a flexible organic light emitting display device of the present disclosure will be assumed as an in-cell type touch panel integrated flexible organic light emitting display device of top-emission type.

FIG. 1A illustrates an organic light emitting display panel 110 of a flexible organic light emitting display device 100. The organic light emitting display panel 110 performs a function of displaying an image according to an image signal input from the outside.

The organic light emitting display panel 110 will be described in detail below. To be specific, the organic light emitting display panel 110 is formed on a first flexible substrate 111. A display area A/A and a peripheral area P/A of the organic light emitting display panel 110 are configured on the first flexible substrate 111.

The display area A/A configured on the first flexible substrate 111 refers to an area configured to display an image by a plurality of pixels including a plurality of organic light emitting elements. The display area A/A of the organic light emitting display panel 110 according to an exemplary embodiment of the present disclosure is configured to have bendability or flexibility. The display area A/A with flexibility can be bent by a user or realized as having a curved surface, but is not limited thereto. The display area A/A can be realized as being flat. Even if the display area A/A is realized as being flat, the display area A/A has flexibility and thus has an advantage of not being fragile by an external shock.

The peripheral area P/A configured on the first flexible substrate 111 refers to a peripheral area of the display area A/A in which a plurality of pad unit and a plurality of lines are positioned. The peripheral area P/A surrounds the display area A/A as illustrated in FIG. 1A. The peripheral area P/A of the organic light emitting display panel 110 according to an exemplary embodiment of the present disclosure may include a bendable area. In this case, the bendable area may be folded so as to realize a narrow bezel or may be configured to include a curved surface so as to realize a curved bezel, but is not limited thereto. The bendable area can be realized as being flat. Even if the bendable area is realized as being flat, it still has bendability and thus has an advantage of not being fragile by external pressure.

The plurality of pad units at the peripheral area P/A is configured to include at least a first pad unit 112.

Figure 1B:
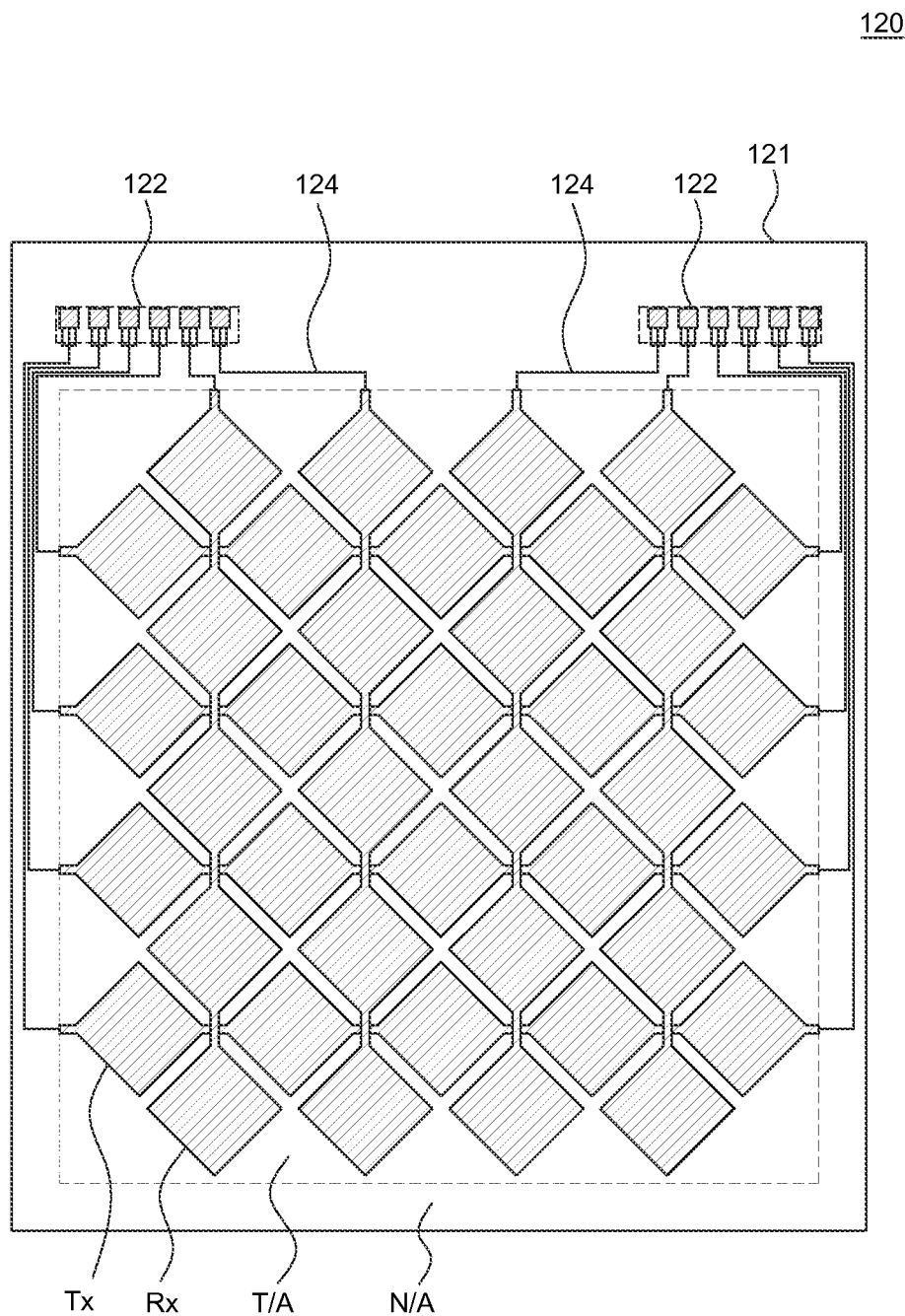

The first pad unit 112 refers to a pad unit configured to be bonded to a second pad unit 122 formed on the second flexible substrate 121, as illustrated in FIG. 1B. The first pad unit 112 is configured to be connected with a first touch line unit 114. Further, the first touch line unit 114 is configured to be electrically connected with a touch panel driving unit.

The touch panel driving unit refers to a circuit unit configured to generate a signal for controlling a touch panel 120 formed on the second flexible substrate 121 illustrated in FIG. 1B and detect a touch position applied by a user onto the display screen. Hereinafter, for convenience in explanation, the touch panel driving unit according to an exemplary embodiment of the present disclosure will be described as being integrated with a driving circuit unit 140, but is not limited thereto. Also, the touch panel driving unit can be configured as being separated from the driving circuit unit 140. If the above-described touch panel driving unit (not illustrated) is installed within the driving circuit unit 140, the first touch line unit 114 is configured to be connected with the driving circuit unit 140.

The driving circuit unit 140 refers to a circuit unit configured to receive an image signal input from the outside and control the display area A/A so as to display an image on the display area A/A. Generally, since the driving circuit unit 140 is realized as a semiconductor integrated circuit, it is rigid and has poor flexibility. Therefore, if the driving circuit unit 140 is mounted at the bendable area of the first flexible substrate 111, when the bendable area is bent, the driving circuit unit 140 is highly likely to be delaminated. However, if the driving circuit unit 140 is not mounted at the bendable area, but mounted on a connection part 135, the bendable area can be bent regardless of the driving circuit unit 140, but it is not limited thereto. The driving circuit unit 140 can be directly mounted on the bendable area.

The connection part 135 refers to a connection part that electrically connects the flexible organic light emitting display device 100 with an external system. The driving circuit 140 is configured to be mounted on the connection part 135 of the flexible organic light emitting display device 100 according to an exemplary embodiment of the present disclosure. The connection part 135 is configured to be bonded to a third pad unit 130. The connection part 135 can be realized as a flexible cable, a flexible printed circuit board (FPCB), or the like, but is not limited thereto.

The third pad unit 130 refers to a pad unit configured to be bonded to the connection part 135 that electrically connects the flexible organic light emitting display device 100 with the external system.

The first touch line unit 114 refers to a line configured to be electrically connected with the first pad unit 112 so as to transmit and receive a touch signal. The number of the first touch line units 114 is determined so as to correspond to the number of channels of a touch electrode formed at the touch panel 120.

FIG. 1B illustrates the touch panel 120 of the flexible organic light emitting display device 100. The touch panel 120 performs a function of detecting a touch position (due to, e.g., a user's finger or a stylus).

The touch panel 120 will be described in detail. The touch panel 120 is formed on the second flexible substrate 121. At the second flexible substrate 121, a touch area T/A and a non-touch area N/A of the touch panel 120 are configured.

The touch area T/A refers to an area where a touch electrode is formed and an electrical signal is generated to detect an input position. The touch area T/A of the touch panel 120 according to an exemplary embodiment of the present disclosure includes a touch electrode unit 126 including a plurality of touch driving electrodes Tx and a plurality of touch detection electrodes Rx intersecting each other. Further, such a configuration is referred to as a mutual-capacitance type. However, the touch area T/A is not limited thereto, and may be of a self-capacitance type. In the self-capacitance type, only a plurality of touch detection electrodes Rx is disposed. Further, the touch panel 120 can be realized as various other types, such as a resistive type or an electromagnetic type.

The non-touch area N/A refers to an area in which the second touch line unit 124 and the second pad unit 122 are formed. The second touch line unit 124 according to an exemplary embodiment of the present disclosure is configured to be electrically connected with the touch electrode at the touch area T/A so as to transfer a touch signal. The second pad unit 122 and the first pad unit 112 formed on the first flexible substrate 111 according to an exemplary embodiment of the present disclosure are bonded to each other by a conductive ball 192. The second pad unit 122 is configured to be connected with the second touch line unit 124.

According to this configuration, a signal generated in the touch area T/A is transferred to the second pad unit 122 through the second touch line unit 124 and transferred to the first pad unit 112 through the conductive ball 192. Then, a signal is transferred to the driving circuit unit 140 including the touch panel driving unit through the first touch line unit 114, so that a touch can be detected.

According to this configuration, the touch panel 120 can be integrated within the flexible organic light emitting display device 100. In other words, flexible organic light emitting display device 100 includes the in-cell type touch panel.

Figure 1C:
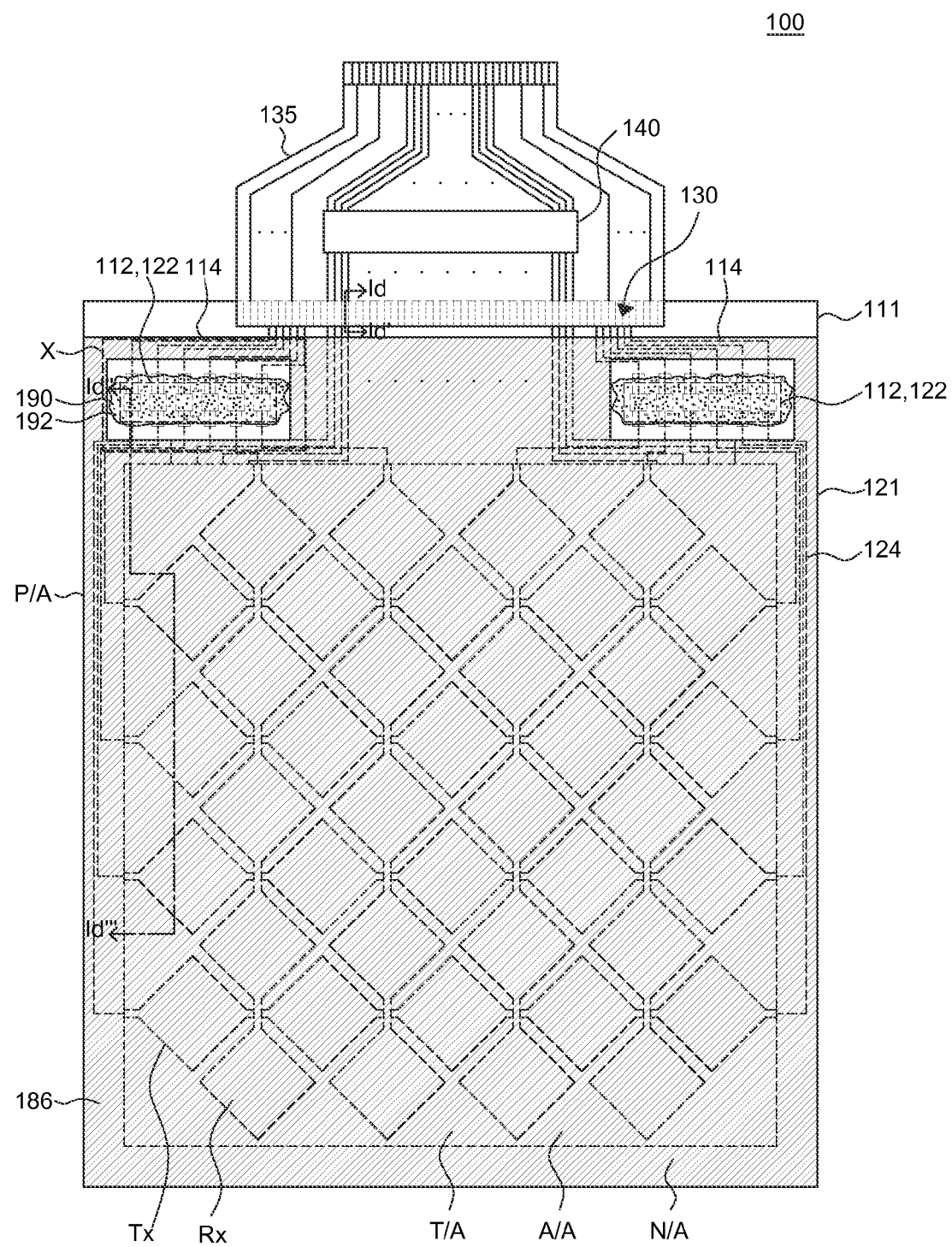

FIG. 1C is a plan view illustrating a state where the organic light emitting display panel 110 illustrated in FIG. 1A is bonded to the touch panel 120 illustrated in FIG. 1B. FIG. 1C illustrates an area in which the first pad unit 112 and the second pad unit 122 are bonded to each other as indicated by a dotted line (X).

The first pad unit 112 and the second pad unit 122 of the flexible organic light emitting display device 100 are bonded to each other by a conductive adhesive layer 190 including a plurality of the conductive balls 192 and are electrically connected with each other. For example, an anisotropic conductive film (ACF) or an anisotropic conductive paste (ACP) may be used as the conductive adhesive layer 190.

In particular, the conductive balls 192 may also be considered as "gap balancing conductive elements", because such can serve a dual purpose. First, it provides a conductive path between the touch electrodes and the touch IC. Second, it provides improved flexibility and reliability for the flexible display device by maintaining or balancing the gap at the peripheral area (P/A) to be equivalent to the gap at the display area (A/A). The present disclosure is not limited by the shape of the conductive balls 192. Shapes of the gap balancing conductive element can be a ball, a column, a hexagon, a rounded shape and etc.

Referring to FIG. 1C, the first flexible substrate 111 and the second flexible substrate 121 are bonded to each other by a transparent adhesive layer 186. The transparent adhesive layer 186 is formed so as to cover the display area A/A but is not formed on the first pad unit 112 and the second pad unit 122. Further, the transparent adhesive layer 186 is formed so as to surround the first pad unit 112 and the second pad unit 122. The transparent adhesive layer 186 is expressed by diagonally hatched lines as illustrated in FIG. 1C.

The transparent adhesive layer 186 has transparency and adhesiveness. The transparent adhesive layer 186 may be formed of any one of olefin-based, acrylic-based, and silicon-based materials. In particular, the transparent adhesive layer 186 may be formed of an olefin-based moisture permeation-delayed material exhibiting hydrophobicity. The transparent adhesive layer 186 is formed to have a thickness of 3 μm to 12 μm.

According to this configuration, the transparent adhesive layer 186 configured to surround the first pad unit 112 and the second pad unit 122 can delay permeation of oxygen and moisture which causes corrosion of the pad units. Thus, there is an effect of delaying corrosion of the first pad unit 112 and the second pad unit 122.

Further, if the transparent adhesive layer 186 is formed so as to surround the first pad unit 112 and the second pad unit 122, as illustrated in FIG. 1C, the transparent adhesive layer 186 fills an empty space around a pad unit. Therefore, a stress (e.g., tensile stress or compressive stress) caused by bending is not concentrated on the pad units but is distributed to the adjacent transparent adhesive layer 186. In other words, the conductive adhesive layer 190 electrically connects the first pad unit 112 and the second pad unit 122. The transparent adhesive layer 186 is patterned to surround the first pad unit 112 and the second pad unit 122. Thus, there is an effect of reducing the possibility of a pad delamination defect or improving durability of the first pad unit 112 and the second pad unit 122.

Further, the area of the second flexible substrate 121 is smaller than the area of the first flexible substrate 111. To be specific, the second flexible substrate 121 is configured so as not to cover the third pad unit 130 formed on the first flexible substrate 111. According to this configuration, when the third pad unit 130 and the connection part 135 are bonded to each other, the second flexible substrate 121 does not cause interference. In order to prevent such interference, for example, the second flexible substrate 121 and the third pad unit 135 may be separated from each other by, but not limited to, 50 μm or more.

The touch area T/A of the touch panel 120 is disposed so as to correspond to the display area A/A of the organic light emitting display panel 110. To be specific, the touch area T/A is configured so as to be overlapped with at least the entire display area A/A. That is, the touch area T/A has an area greater than the display area A/A. According to this configuration, not only a touch position input into the entire display area A/A, but also a touch position input into the peripheral area P/A can be detected.

Further, since the flexible organic light emitting display device 100 according to an exemplary embodiment of the present disclosure is of a top-emission type, the touch panel 120 is configured to transmit an image displayed on the organic light emitting display panel 110. Therefore, the touch area T/A overlapped with the display area A/A is configured to have an optical transmissivity of 90% or more.

Figure 1D:
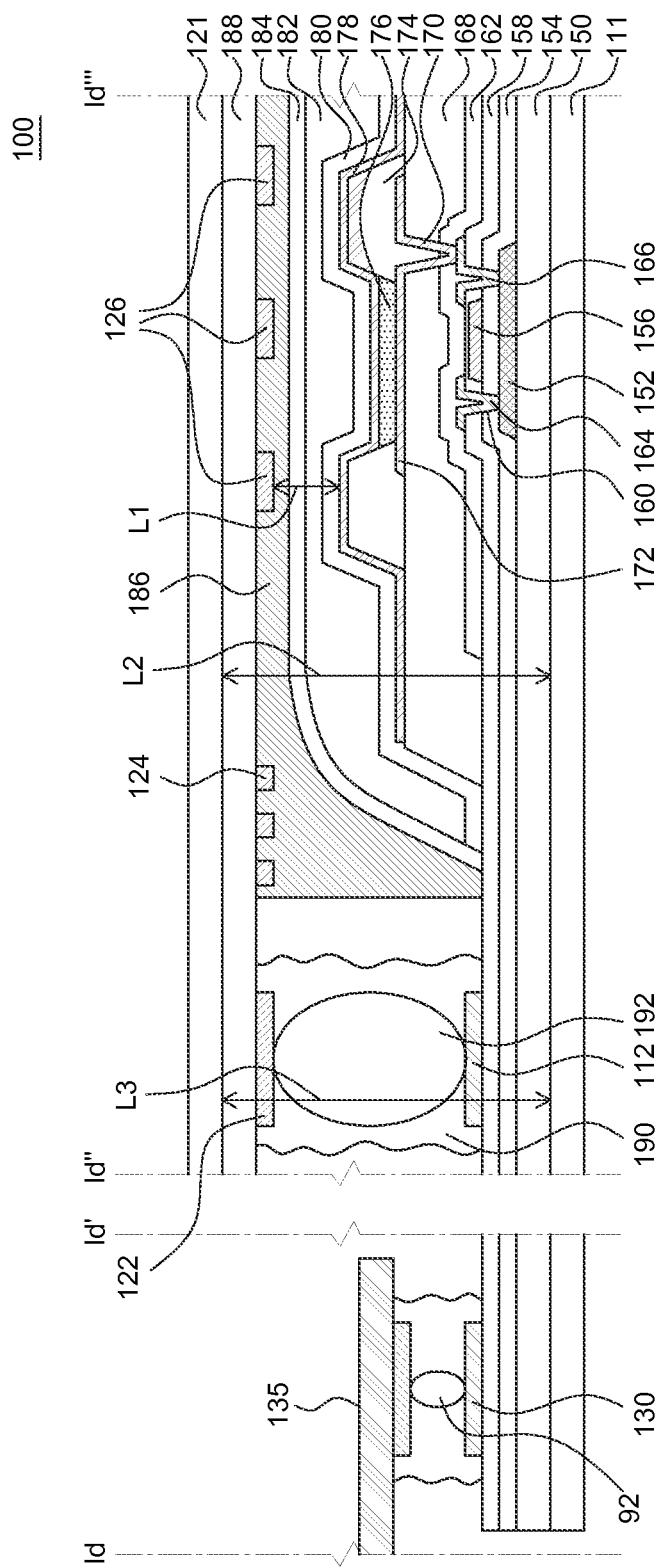
FIG. 1D is a schematic cross-sectional view of the flexible organic light emitting display device according to an exemplary embodiment of the present disclosure.

FIG. 1D illustrates a cross section taken along lines id-id' and id"-id'" of FIG. 1C.

The cross section of the flexible organic light emitting display device 100 according to an exemplary embodiment of the present disclosure will be described in detail with reference to FIG. 1D.

The flexible organic light emitting display device 100 according to an exemplary embodiment of the present disclosure is configured to include the first flexible substrate 111, the first pad unit 112, the second pad unit 122, the third pad unit 130, the connection part 135, a multi-buffer layer 150, an active layer 152, a gate insulation film 154, a gate electrode 156, an interlayer insulation film 158, a first contact hole 160, a thin-film transistor insulation film 162, a source electrode 164, a drain electrode 166, a planarization layer 168, a second contact hole 170, a first electrode 172, a bank 174, an organic light emission layer 176, a second electrode 178, a first encapsulation layer 180, a particle compensation layer 182, a second encapsulation layer 184, the transparent adhesive layer 186, a third encapsulation layer 188, the conductive adhesive layer 190, the conductive ball 192, and the second flexible substrate 121, but is not limited thereto. Some of the elements may be omitted or may be substituted with other similar elements.

A material and thickness of the first flexible substrate 111 according to an exemplary embodiment of the present disclosure need to be determined in consideration of flexibility suitable for a flexible display and thermal resistance and chemical resistance suitable for a deposition process of a thin-film transistor (TFT). The first flexible substrate 111 may be formed of, for example, polyimid having a thickness of about 10 to 30 μm, and for example, polyimid having a thickness of 15 μm, but is not limited thereto. Further, in the case of the top-emission flexible organic light emitting display device 100, the first flexible substrate 111 is configured so as not to transmit light emitted from the organic light emission layer. Thus, a high transparency is not required.

The multi-buffer layer 150 according to an exemplary embodiment of the present disclosure is formed on the first flexible substrate 111. The multi-buffer layer 150 includes a plurality of inorganic layers in order to delay the arrival of oxygen and moisture permeating through the first flexible substrate 111 at the organic light emission layer 176.

The multi-buffer layer 150 may be formed of, for example, a double-layer of inorganic layers of different materials, more for example, silicon nitride (SiNx) and silicon oxide (SiOx). for example, the multi-buffer layer 150 may be formed of a four-layer structure of SiNx/SiOx/SiNx/SiOx with a thickness of 1000 Å/1000 Å/1000 Å/1000 Å in consideration of flexibility and a moisture permeation-delaying property, but is not limited thereto.

A plurality of thin-film transistors (TFT) is formed on the multi-buffer layer 150.

The plurality of thin-film transistors (TFT) according to an exemplary embodiment of the present disclosure includes at least the active layer 152, the gate insulation film 154, the gate electrode 156, the interlayer insulation film 158, the thin-film transistor insulation film 162, the source electrode 164, and the drain electrode 166. This structure may be referred to as a coplanar transistor structure. The plurality of thin-film transistors (TFT) may control luminance of a plurality of pixels so as to display a desired image. Hereinafter, the plurality of thin-film transistors (TFT) will be described in detail.

The active layer 152 can be formed of oxide-semiconductor or silicon-semiconductor.

In the active layer 152, for example, an area in contact with the source electrode 164 and the drain electrode 166 may have a conductor property and an area overlapped with the gate electrode 156 may have a semiconductor property. For example, such properties may be realized by performing, but not limited to, a plasma process or a particle doping process to an area for the source electrode 164 and the drain electrode 166.

The gate insulation film 154 electrically insulates the active layer 152 and the gate electrode 156. The gate insulation film 154 may be formed of, for example, silicon-based materials or aluminum oxide ($Al_2O_3$). For example, the gate insulation film 154 may be formed of silicon oxide having thickness of about 600 Å to 1400 Å considering flexibility suitable for flexible display, an electrical insulation property, and a variable semiconductor property of the active layer 152 in response to an electrical signal applied to the gate electrode 156, but is not limited thereto.

The gate electrode 156 is formed on the gate insulation film 154. The gate electrode 156 is electrically insulated from the active layer 152 by the gate insulation film 154. The active layer 152 has a conductive or semiconductive property in response to the electrical signal applied to the gate electrode 156. The gate electrode 156 may be formed of, for example, a highly conductive material, for example, any one of molybdenum (Mo), aluminum (Al), chromium (Cr), gold (Au), titanium (Ti), nickel (Ni), neodymium (Nd), and copper (Cu), or an alloy thereof, or a multilayered structure thereof. For example, the gate electrode 156 may be formed of molybdenum having a thickness of 2000 Å in consideration of flexibility suitable for flexible display and conductivity, but is not limited thereto.

The gate electrode 156 is configured to be applied with an electrical signal from a gate driver.

The interlayer insulation film 158 is formed on the gate insulation film 154 and the gate electrode 156. The interlayer insulation film 158 electrically insulates the gate electrode 156 from the source electrode 164 and the drain electrode 166. The interlayer insulation film 158 may be formed of, for example, an inorganic substance to have greater thickness than the gate insulation film 154. For example, the interlayer insulation film 158 may be formed of a laminate having a total thickness of 5000 Å including silicon oxide having a thickness of 2000 Å and silicon nitride having a thickness of 3000 Å in consideration of flexibility and an electrical insulation property in order to minimize a parasitic capacitance formed by the gate electrode 156, the source electrode 164, and the drain electrode 166, but is not limited thereto.

The source electrode 164 is formed on the interlayer insulation film 158. The source electrode 164 is applied with a signal corresponding to an image from the driving circuit unit 140. The source electrode 164 may be formed of, for example, a highly conductive material, for example, any one of molybdenum (Mo), aluminum (Al), chromium (Cr), gold (Au), titanium (Ti), nickel (Ni), neodymium (Nd), and copper (Cu), or an alloy thereof, or a multilayered structure thereof. For example, the source electrode 164 may be formed of a three-layer structure of Ti/Al/Ti with a thickness of 500 Å/4000 Å/500 Å in consideration of conductivity and flexibility suitable for flexible display, but is not limited thereto.

The source electrode 164 is electrically connected with one side surface of the active layer 152 through the first contact hole 160 formed at the gate insulation film 154 and the interlayer insulation film 158. The source electrode 164 is applied with a signal generated by the driving circuit unit 140.

The drain electrode 166 is formed in the same manner as the source electrode 164 at the same time. Therefore, redundant descriptions thereof will be omitted. The drain electrode 166 is electrically connected with an opposite side surface of the active layer 152 through the first contact hole 160 formed at the gate insulation film 154 and the interlayer insulation film 158. When the active layer 152 is in a conductive state, the drain electrode 166 is applied with a voltage, which is applied to the source electrode 164, through the active layer 152.

The thin-film transistor (TFT) has been illustrated as having a coplanar structure, but is not limited thereto, and the thin-film transistor may have an inverted-staggered structure.

The first pad unit 112 or the third pad unit 130 is formed at the same time when the source electrode 164 and the drain electrode 166 are formed, but is not limited thereto. The first pad unit 112 or the third pad unit 130 may be formed at the same time when the gate electrode 156 is formed.

The second pad unit 122 is formed at the same time when the touch electrode unit 126 is formed, but is not limited thereto. The second pad unit 122 may be formed at the same time when the first touch line unit 114 is formed.

The thin-film transistor insulation film 162 is formed on the interlayer insulation film 158, the source electrode 164, and the drain electrode 166. The thin-film transistor insulation film 162 performs a function of increasing a life of the organic light emission layer 176 by delaying the permeation of moisture and oxygen which may permeate into the organic light emission layer 176 from the first flexible substrate 111 through the thin-film transistor (TFT). The thin-film transistor insulation film 162 may be formed of, for example, an inorganic substance, for example, silicon nitride, and for example, silicon nitride having a thickness of 2500 Å to 4000 Å in order for the thin-film transistor insulation film 162 to perform the function of delaying the permeation of moisture and oxygen while maintaining flexibility, but is not limited thereto.

The thin-film transistor insulation film 162 can delay the permeation of moisture and oxygen into the organic light emission layer 176 from the thin-film transistor (TFT) and thus increase a life of the flexible organic light emitting display device 100.

The planarization layer 168 is formed on the thin-film transistor insulation film 162. The planarization layer 168 planarizes an upper surface of the non-flat thin-film transistor insulation film 162 including various elements of the thin-film transistor (TFT). The first electrode 172 is formed on the planarization layer 168. The planarization layer 168 provides a flat surface such that the first electrode 172 is formed to be flat. At the same time, the planarization layer 168 minimizes a parasitic capacitance formed between the thin-film transistor (TFT) and the first electrode 172. In this respect, the planarization layer 168 may be formed of, for example, an organic substance having flowability, for example, photo acryl having a low permittivity, and for example, photo acryl having a thickness of 2 μm to 3 μm, but is not limited thereto. Further, the planarization layer 168 may include a non-flat structure formed in a partial area of the planarization layer 168 in order to improve light extraction efficiency of the organic light emitting element. For example, the non-flat structure may further include a micro lens array (MLA), an uneven or diffused reflection pattern, and the like.

A plurality of organic light emitting elements formed on the plurality of thin-film transistors (TFT) will be described with reference to FIG. 1D again.

The organic light emitting element includes the first electrode 172, the organic light emission layer 176, and the second electrode 178. Each of the organic light emitting elements is configured to emit any one of red, green, blue, and white lights. The plurality of organic light emitting elements is separated by the banks 174.

The first electrode 172 is electrically connected with the drain electrode 166 through the second contact hole 170 formed at the thin-film transistor insulation film 162 and the planarization layer 168. The first electrode 172 is formed of a conductive material having a high work function in order to supply a hole to the organic light emission layer 176.

The first electrode 172 is patterned in the unit of a sub-pixel on the planarization layer 168. That is, a shape of a plurality of sub-pixels of the flexible organic light emitting display device 100 is formed so as to correspond to the patterned shape of the first electrode 172.

Referring to FIG. 1D again, the bank 174 is formed so as to cover the planarization layer 168 and a partial area of the periphery of the first electrode 172. The bank 174 may be formed of an organic insulation material, for example, any one of polyimide, photo acryl, and benzocyclobutene (BCB).

The second electrode 178 is formed on the bank 174 and the organic light emission layer 176. The second electrode 178 is formed of a material having a low work function in order to supply an electron to the organic light emission layer 176. If it is formed of a metallic material having a low work function, indium-zinc-oxide (IZO), silver (Ag), titanium (Ti), aluminum (Al), molybdenum (Mo), or an alloy of silver (Ag) and magnesium (Mg) may be used. The second electrode 178 of the top-emission type flexible organic light emitting display device 100 is configured to have transparency in order to transmit light toward an upper surface. The second electrode 178 is configured to be applied with a base voltage (Vss) or a ground voltage (GND).

The organic light emitting element emits a light from the organic light emission layer 176 corresponding to a potential difference between a voltage applied to the first electrode 172 and a voltage applied to the second electrode 178. The emitted light is reflected by a reflector formed on a rear surface of the first electrode 172 toward an upper surface. Since the second electrode 178 transmits the reflected light, the flexible organic light emitting display device 100 can display an image.

A transparent flexible encapsulation unit formed on an upper surface of the organic light emitting element will be described with reference to FIG. 1D again.

The transparent flexible encapsulation unit of the flexible organic light emitting display device 100 includes at least the first encapsulation layer 180, the particle compensation layer 182, and the second encapsulation layer 184. The transparent flexible encapsulation unit has a stacked structure for example, an inorganic substance, an organic substance, and an inorganic substance in order to delay the arrival of oxygen and moisture permeating through the transparent flexible encapsulation unit of the flexible organic light emitting display device 100 at the organic light emission layer 176.

The first encapsulation layer 180 is formed of an inorganic substance. For example, the first encapsulation layer 180 may be formed of any one of silicon nitride (SiNx) or aluminum oxide ($Al_2O_3$) by a vacuum film forming method such as chemical vapor deposition (CVD) or atomic layer deposition (ALD), but is not limited thereto. Further, the first encapsulation layer 180 is configured to have transparency satisfying a visible transmissivity of 90% or more in order to transmit light emitted from the organic light emission layer 176. Furthermore, the first encapsulation layer 180 needs to be deposited at 110° C. or less in order not to damage the organic light emission layer 176 while the first encapsulation layer 180 is formed.

The first encapsulation layer 180 may be formed of, for example, aluminum oxide or silicon nitride, for example, silicon nitride having a thickness of 5000 Å to 15000 Å or aluminum oxide having a thickness of 200 Å to 1500 Å in consideration of flexibility and a moisture permeation-delaying property, but is not limited thereto. In particular, if the first encapsulation layer 180 is formed of aluminum oxide, it can be formed thin with excellent flexibility as compared with silicon nitride.

The particle compensation layer 182 is formed of an organic substance having flowability. The particle compensation layer 182 performs a function of compensating a crack of the first encapsulation layer 180 caused by a particle or particle introduced when the first encapsulation layer 180 is formed. The particle compensation layer 182 may be formed of, for example, an organic substance having a high flowability, for example, a silicon oxycarbon (SiOCz), acryl, or epoxy-based resin, and for example, an organic substance having a thickness of 2 μm to 20 μm and a viscosity of 500 cp (centipoise) to 30000 cp, but is not limited thereto. Further, the particle compensation layer 182 is configured to have transparency satisfying a visible transmissivity of 90% or more in order to transmit light emitted from the organic light emission layer 176. Furthermore, the particle compensation layer 182 needs to be deposited at 110° C. or less in order not to damage the organic light emission layer 176 while the particle compensation layer 182 is formed.

The second encapsulation layer 184 is formed of an inorganic substance. For example, the second encapsulation layer 184 may be formed of any one of silicon nitride (SiNx) or aluminum oxide ($Al_2O_3$) by a vacuum film forming method such as chemical vapor deposition or atomic layer deposition, but is not limited thereto. Further, the second encapsulation layer 184 is configured to have transparency satisfying a visible transmissivity of 90% or more in order to transmit light emitted from the organic light emission layer 176. Furthermore, the second encapsulation layer 184 needs to be deposited at 110° C. or less in order not to damage the organic light emission layer 176 while the second encapsulation layer 184 is formed.

The second encapsulation layer 184 may be formed of, for example, silicon nitride, and for example, silicon nitride having a thickness of 5000 Å to 15000 Å or aluminum oxide having a thickness of 200 Å to 1500 Å in consideration of flexibility and a moisture permeation-delaying property, but is not limited thereto. In particular, if the second encapsulation layer 184 is formed of aluminum oxide, it can be formed to be thin with excellent flexibility as compared with silicon nitride.

The transparent flexible encapsulation unit has transparency for transmitting light emitting from the organic light emission layer 176 together with excellent flexibility while achieving an excellent moisture permeation-delaying property.

The organic light emitting display panel 110 formed on the first flexible substrate 111 has been described above.

Hereinafter, the touch panel 120 formed on the second flexible substrate 121 will be described.

The touch panel 120 is configured to include the second flexible substrate 121, the third encapsulation layer 188, the touch electrode unit 126, the touch line unit 124, and the second pad unit 122.

A material and thickness of the second flexible substrate 121 according to an exemplary embodiment of the present disclosure need to be determined in consideration of flexibility suitable for flexible display and thermal resistance and chemical resistance suitable for a deposition process of a thin-film transistor (TFT). The second flexible substrate 121 may be formed of, for example, polyimid having a thickness of about 10 to 30 μm, and for example, polyimid having a thickness of 15 μm, but is not limited thereto. Further, in the case of the top-emission flexible organic light emitting display device 100, the second flexible substrate 121 is configured to transmit light emitted from the organic light emission layer. Thus, a high transmissivity is required.

The third encapsulation layer 188 according to an exemplary embodiment of the present disclosure may be formed of, for example, a double-layer of inorganic layers of different materials, for example, silicon nitride (SiNx) and silicon oxide (SiOx). for example, the third encapsulation layer 188 may be formed of a four-layer structure of SiNx/SiOx/SiNx/SiOx with a thickness of 1000 Å/1000 Å/1000 Å/1000 Å in consideration of flexibility and a moisture permeation-delaying property, but is not limited thereto. According to this configuration, a plurality of organic light emitting elements may have an excellent encapsulation property since the permeation of moisture and oxygen is delayed by the first encapsulation layer 180, the second encapsulation layer 184, and the third encapsulation layer 188.

The touch electrode unit 126 according to an exemplary embodiment of the present disclosure is formed of a transparent conductive material. The touch electrode unit 126 may be formed of, for example, ITO (indium-tin-oxide), and more for example, ITO having a thickness of 100 Å to 1000 Å, but is not limited thereto, and can be formed of metal-mesh or graphene.

The organic light emitting display panel 110 formed on the first flexible substrate 111 and the touch panel 120 formed on the second flexible substrate 121 are disposed to face each other and bonded to each other by the transparent adhesive layer 186.

Further, a parasitic capacitance formed between the second electrode 178 and the touch electrode unit 126 is inversely proportional to a gap L1 therebetween. If the parasitic capacitance increases, touch sensitivity decreases. Therefore, in order to minimize a parasitic capacitance, for example, the gap L1 between the second electrode 178 and the touch electrode unit 126 is set to at least 4 μm or more, but is not limited thereto.

On the other hand, if the gap L1 between the second electrode 178 and the touch electrode unit 126 increases, the flexibility of the flexible organic light emitting display device 100 is decreased. Further, if the gap L1 increases, a diameter of the conductive ball 192 may be increased on the basis of the increment portion of the gap L1. In this case, the possibility of a line break at the touch line unit increases. Therefore, the gap L1 may be set, for example, at least 13 μm or less in consideration of flexibility of the flexible organic light emitting display device 100, but is not limited thereto.

With the gap L1, the flexible organic light emitting display device 100 can achieve both excellent flexibility and touch performance. For example, the gap L1 is determined from 4 μm to 13 μm.

A gap L2 between the first flexible substrate 111 and the second flexible substrate 121 at the display area A/A is determined depending on thicknesses of the laminated thin-film transistor (TFT), organic light emitting element, transparent flexible encapsulation unit, transparent adhesive layer 186, and the like. Thickness of each element may vary if necessary.

The gap L2 is determined by the total thickness of all of the elements formed between the first flexible substrate 111 and the second flexible substrate 121.

For example, the gap L2 according to an exemplary embodiment of the present disclosure may be set in the range of, for example, 15 μm to 33 μm, but is not limited thereto.

Meanwhile, if a related art conductive ball 92 such that the typical diameter is less than 5 μm which is not designed for the in-cell type touch panel integrated flexible organic light emitting display device of the present disclosure is used for connecting the first pad unit 112 and the second pad unit 122, a gap between the first flexible substrate 111 and the second flexible substrate 121 at the peripheral area P/A is shorter than the gap L2 at the display area A/A. To be specific, since some elements included the organic light emitting element, (e.g., the thin-film transistor (TFT), and the transparent encapsulation unit) at the display area A/A may be excluded at the peripheral area P/A. Therefore, the overall thicknesses of the elements formed between the first flexible substrate 111 and the second flexible substrate 121 at the peripheral area P/A are relatively small. Therefore, the gap between the first flexible substrate 111 and the second flexible substrate 121 at the peripheral area P/A may be shorter than the gap L2.

That is, since the gap between the first flexible substrate 111 and the second flexible substrate 121 at the peripheral area P/A is shorter than the gap L2, the peripheral area P/A and the display area P/A may not be formed to be flat. Therefore, in order to form the peripheral area P/A and the display area P/A to be flat, a diameter of the conductive ball 192 bonded between the first pad unit 112 and the second pad unit 122 at the peripheral area P/A may be increased for balancing. For example, considering the total thickness of the transparent adhesive layer 186, the thin-film transistor (TFT), the organic light emitting element, and the transparent flexible encapsulation unit, the diameter of the conductive ball 192 may be set corresponding thereto. According to this configuration, the display area A/A and the peripheral area P/A are compensated so as to be flat. Thus, the gap L2 can be equivalent to a gap L3. Therefore, a stress applied to the first pad unit 112 and the second pad unit 122 is not concentrated on the bonded conductive ball 192 but uniformly distributed to the peripheral P/A.

In conclusion, the diameter of the conductive ball 192 of the in-cell type touch panel integrated flexible organic light emitting display device 100 for connecting the first pad unit 112 and second pad unit 122 may be determined for balancing in consideration of a difference between the total thickness of the elements formed on the peripheral area P/A and the total thickness of the elements formed on the display area A/A, but is not limited thereto. The thickness can be set such that a difference between the gap L2 and the gap L3 is less than 10% or a gap tolerance is less than 10%.

Also, thickness of the transparent adhesive layer 186 configured to surround the first pad unit 112 and the second pad unit 122 may correspond to the diameter of the conductive ball 192. According to this configuration, since a stress applied to the first pad unit 112 and the second pad unit 122 is distributed to the transparent adhesive layer 186, the first pad unit 112 and the second pad unit 122 can be more reliably bonded to each other. Even if the area corresponding thereto is bent, the stress can be more uniformly distributed. Thus, excellent flexibility can be realized.

The connection part 135 is bonded onto the third pad unit 130 by the related art conductive ball 92. The related art conductive ball 92 is a widely used conductive ball having a diameter of about 5 μm. For example, if a diameter of the conductive ball is larger than the width of a signal line, it is easier to cause line break problem at the signal line when the conductive ball is pressed on the signal line. Also, if a diameter of the conductive ball is larger than the line pitch of the adjacent lines, the adjacent lines may be short-circuited through the conductive ball positioned between the adjacent lines. Therefore, in the related art, there is no motivation to increase the diameter of the conductive ball and a conductive ball having a relatively smaller diameter is preferred. However, in clear contrast, for the in-cell type touch panel integrated flexible organic light emitting display device 100, the diameter of the conductive ball needs to be increased for balancing the gap difference of the display area A/A and the peripheral area P/A.

Figure 2:
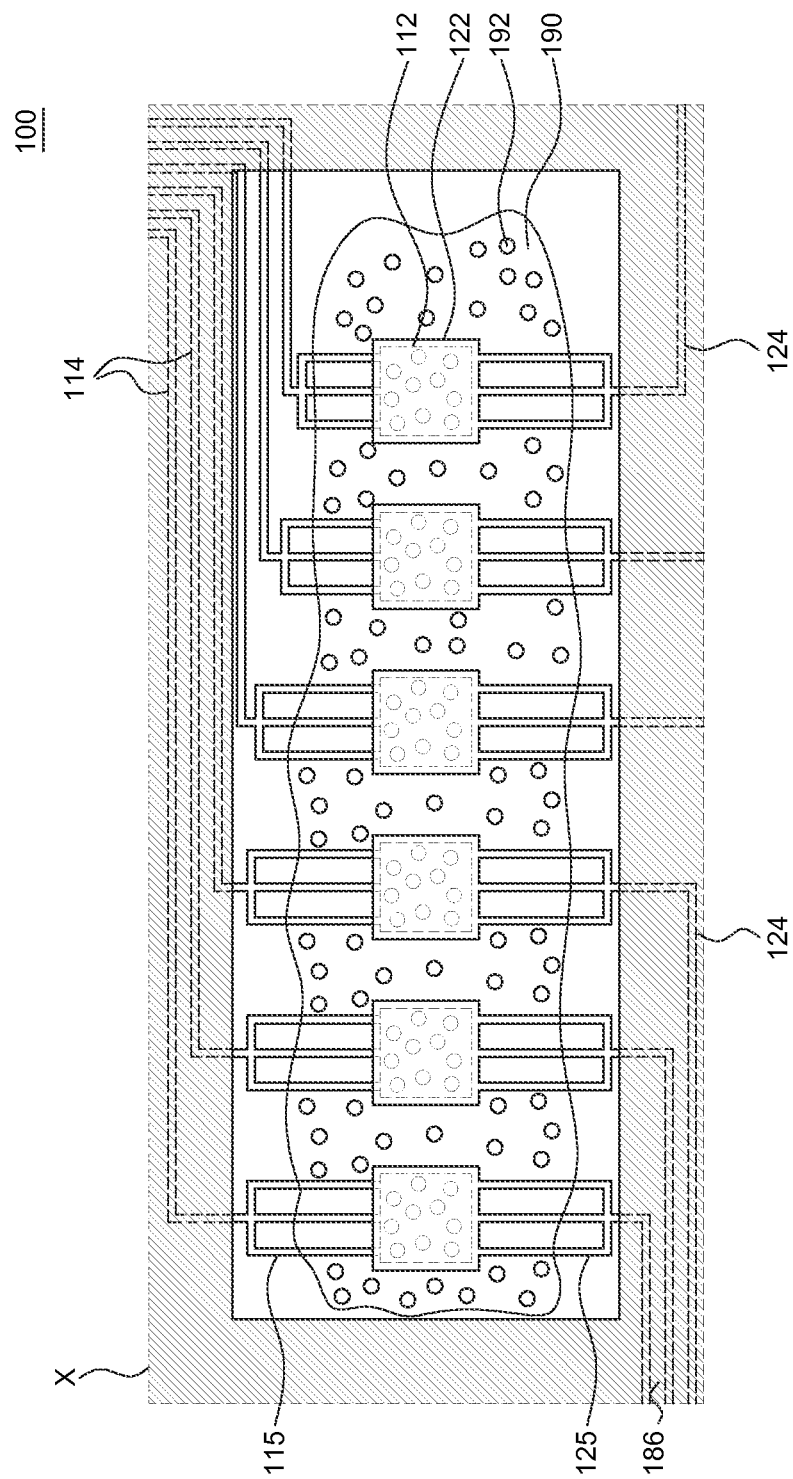
FIG. 2 is an enlarged plan view of a pad unit of the flexible organic light emitting display device according to an exemplary embodiment of the present disclosure.

FIG. 2 is an enlarged plan view of a rectangular area X indicated by a dotted line in FIG. 1C. A diameter of a plurality of conductive balls 192 is determined so as to improve flatness of the peripheral area P/A and the display area A/A. Particularly, in this case, the diameter of the plurality of conductive balls 192 may be larger than a width of the first touch line unit 114 and the second touch line unit 124. Thus, when the conductive balls 192 are bonded onto the first touch line unit 114, the first touch line unit 114 may be cut or broken. Likewise, when the conductive balls 192 are bonded onto the second touch line unit 124, the second touch line unit 124 may be cut or broken.

The flexible organic light emitting display device 100 according to an exemplary embodiment of the present disclosure includes an auxiliary touch line unit which can improve a defect caused by a line break or reduce a stress applied to the pad units. To be specific, the first touch line unit 114 in an area coated with the conductive adhesive layer 190 including the conductive balls 192 is configured to include a first auxiliary touch line unit 115. Likewise, the second touch line unit 124 is configured to include a second auxiliary touch line unit 125.

In each first auxiliary touch line unit 115, a plurality of lines is separated in parallel with each other at an equal gap (e.g., line pitch). One end of each first auxiliary touch line unit 115 is connected to the first pad unit 112. An opposite end of each first auxiliary touch line unit 115 is connected with each first touch line unit 114. A gap between the first auxiliary touch line units 115 is set to be greater than at least the diameter of the conductive ball 192, but is not limited thereto.

In each second auxiliary touch line unit 125, a plurality of lines is separated in parallel with each other at an equal gap. One end of each second auxiliary touch line unit 125 is connected to the second pad unit 122. An opposite end of each second auxiliary touch line unit 125 is connected with each second touch line unit 124. A gap between the second auxiliary touch line units 125 is set to be greater than at least the diameter of the conductive ball 192, but is not limited thereto.

The number of the plurality of lines of the first auxiliary touch line unit 115 may be the same as the number of the plurality of lines of the second auxiliary touch line unit 125, but is not limited thereto, and may be different from each other.

According to this configuration, even if one of the plurality of lines of the first auxiliary touch line unit 115 is cut or broken by the conductive ball 192, connection can be made by the other lines. Therefore, there is an effect of reducing a line break caused by an increase in diameter of the plurality of conductive balls 192.

Figure 3:
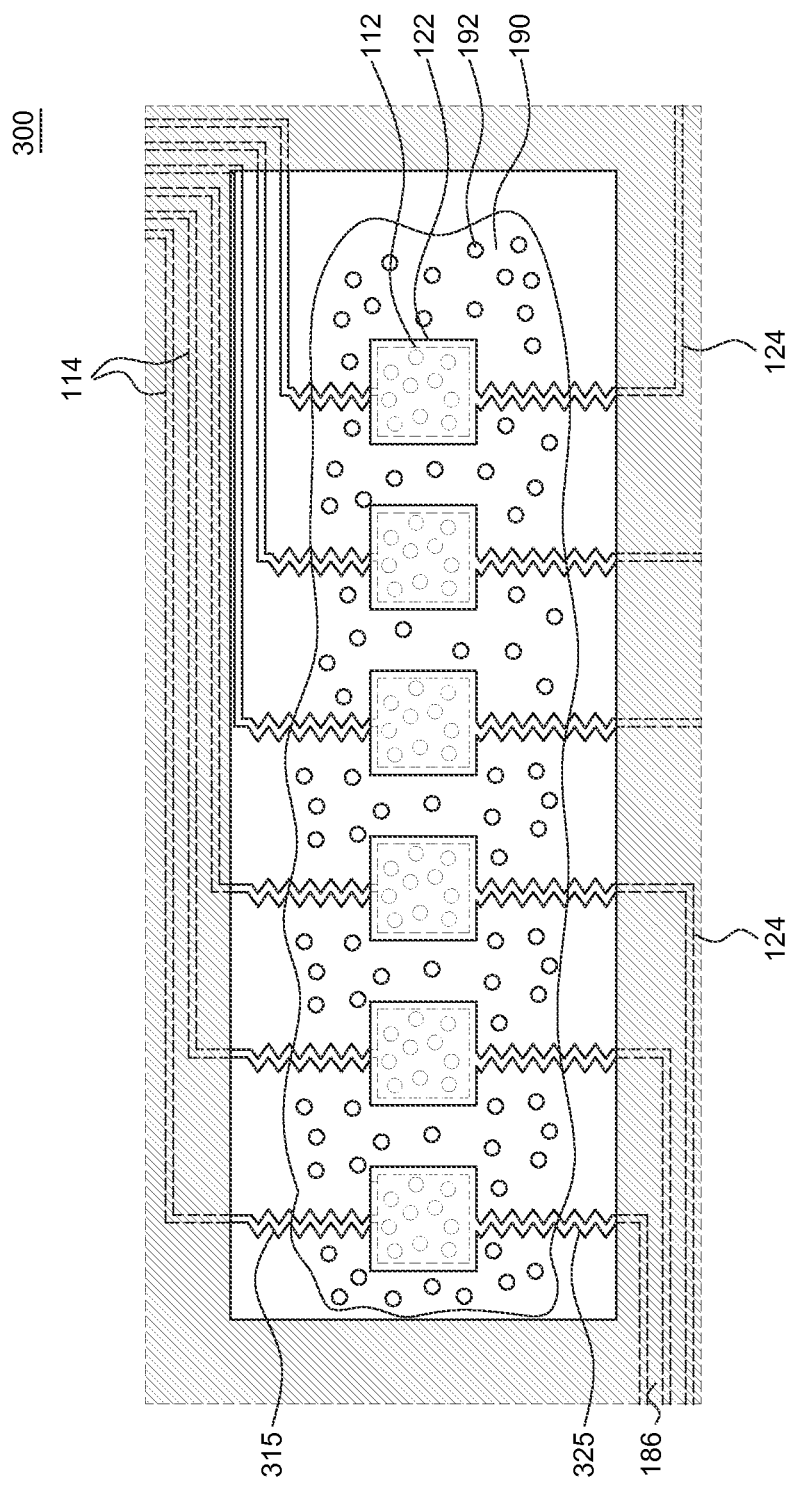
FIG. 3 is an enlarged plan view of a pad unit of a flexible organic light emitting display device according to another exemplary embodiment of the present disclosure.

Hereinafter, a flexible organic light emitting display device according to another exemplary embodiment of the present disclosure will be described with reference to FIG. 3. The first touch line unit 114 and the second touch line unit 124 formed on a pad unit of a flexible organic light emitting display device 300 are respectively configured to include a first auxiliary touch line unit 315 and a second auxiliary touch line unit 325 each has a zigzag shape. According to this configuration, if the pad unit is bent, a stress applied to the line units is reduced. Thus, durability to repeated bending is improved.

The flexible organic light emitting display device 300 according to another exemplary embodiment of the present disclosure is the same as the flexible organic light emitting display device 100 according to an exemplary embodiment of the present disclosure except the above-described part. Thus, redundant descriptions thereof will be omitted.

Figure 4:
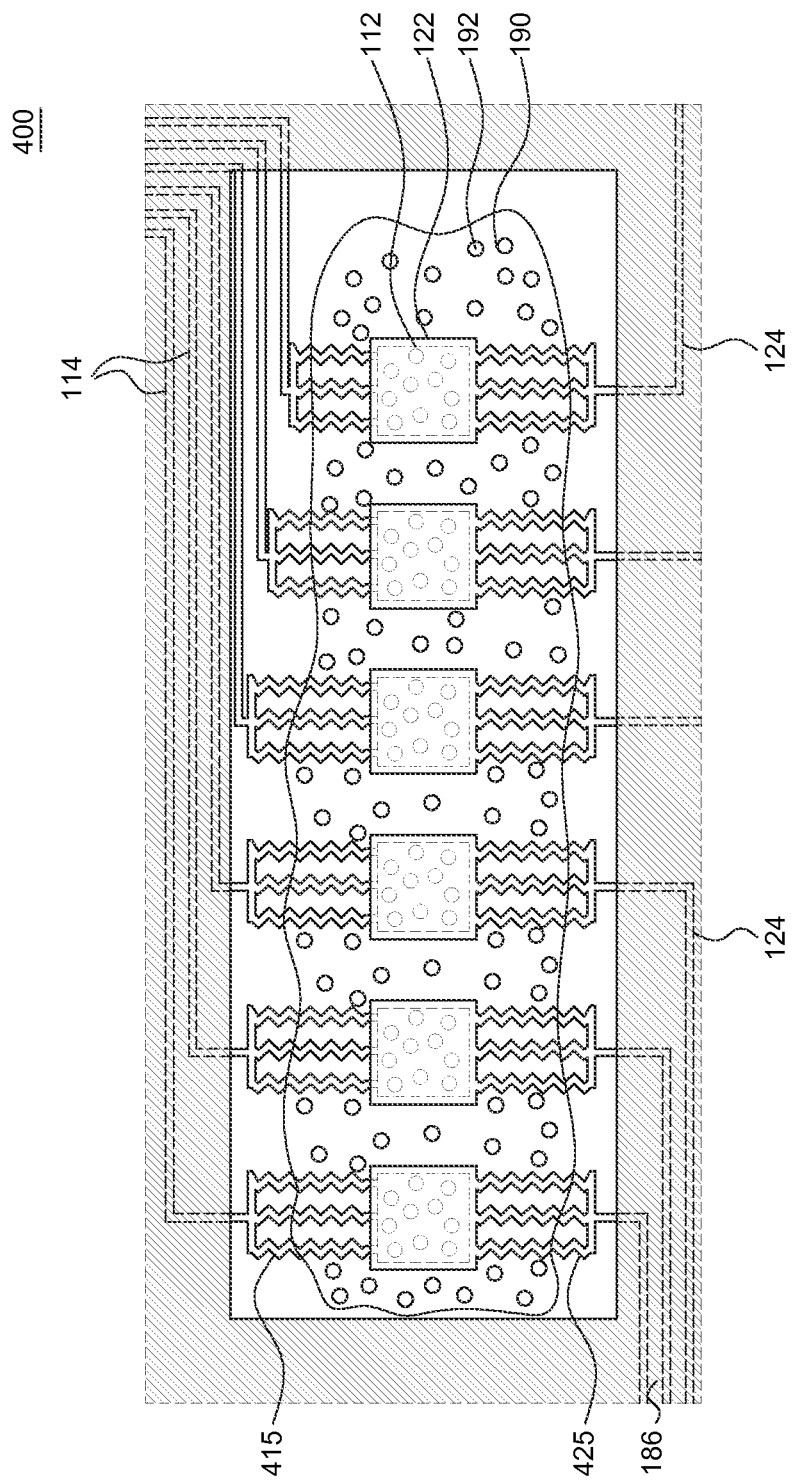
FIG. 4 to FIG. 7 are enlarged plan views of a pad unit of the flexible organic light emitting display device according to yet another exemplary embodiment of the present disclosure.

Hereinafter, a flexible organic light emitting display device according to yet another exemplary embodiment of the present disclosure will be described with reference to FIG. 4. The first touch line unit 114 and the second touch line unit 124 formed on a pad unit of a flexible organic light emitting display device 400 are respectively configured to include a first auxiliary touch line unit 415 including a plurality of first lines which is separated each other and a second auxiliary touch line unit 425 including a plurality of second lines which is separated each other, and each lines having a zigzag shape. According to this configuration, if the pad unit is bent, a stress applied to the line units is reduced, if a line is cut or broken caused by the plurality of conductive balls 192, connection can be made by the other lines and, thus, durability to repeated bending is improved even if the diameter of the conductive ball 192 is larger than the width of anyone of the touch line units.

The flexible organic light emitting display device 400 according to yet another exemplary embodiment of the present disclosure is the same as the flexible organic light emitting display device 100 according to an exemplary embodiment of the present disclosure except the above-described part. Thus, redundant descriptions thereof will be omitted.

Figure 5:
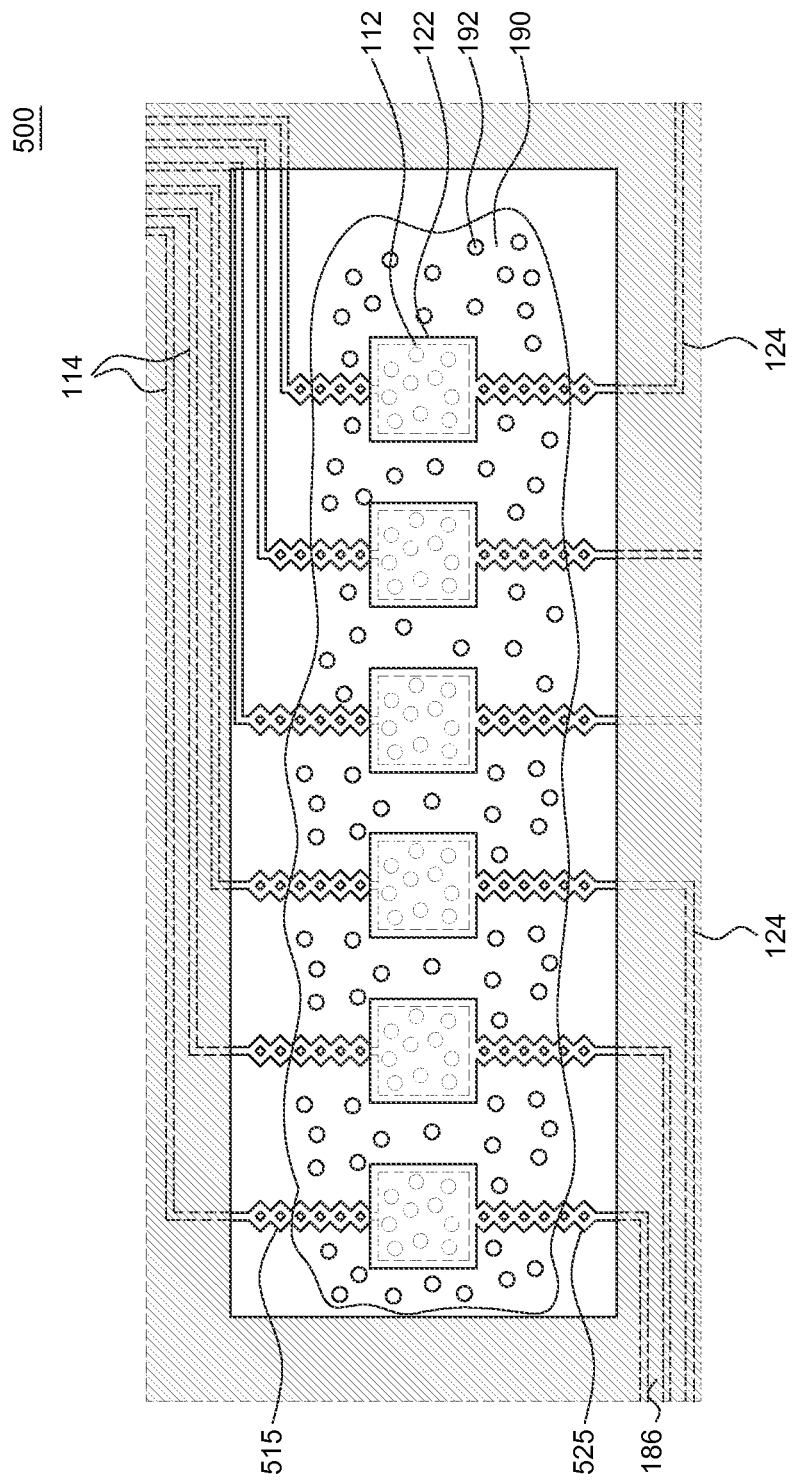

Hereinafter, a flexible organic light emitting display device according to still another exemplary embodiment of the present disclosure will be described with reference to FIG. 5. The first touch line unit 114 and the second touch line unit 124 formed on a pad unit of an flexible organic light emitting display device 500 are respectively configured to include a first auxiliary touch line unit 515 and a second auxiliary touch line unit 525 each has a diamond shape. According to this configuration, if the pad unit is bent, a stress applied to the line units is reduced, if a portion of the line is cut or broken caused by the plurality of conductive balls 192, connection can be made by the other portion of the line and, thus, durability to repeated bending is improved even if the diameter of the conductive ball 192 is larger than the width of anyone of the touch line units.

The flexible organic light emitting display device 500 according to still another exemplary embodiment of the present disclosure is the same as the flexible organic light emitting display device 100 according to an exemplary embodiment of the present disclosure except the above-described part. Thus, redundant descriptions thereof will be omitted.

Figure 6:
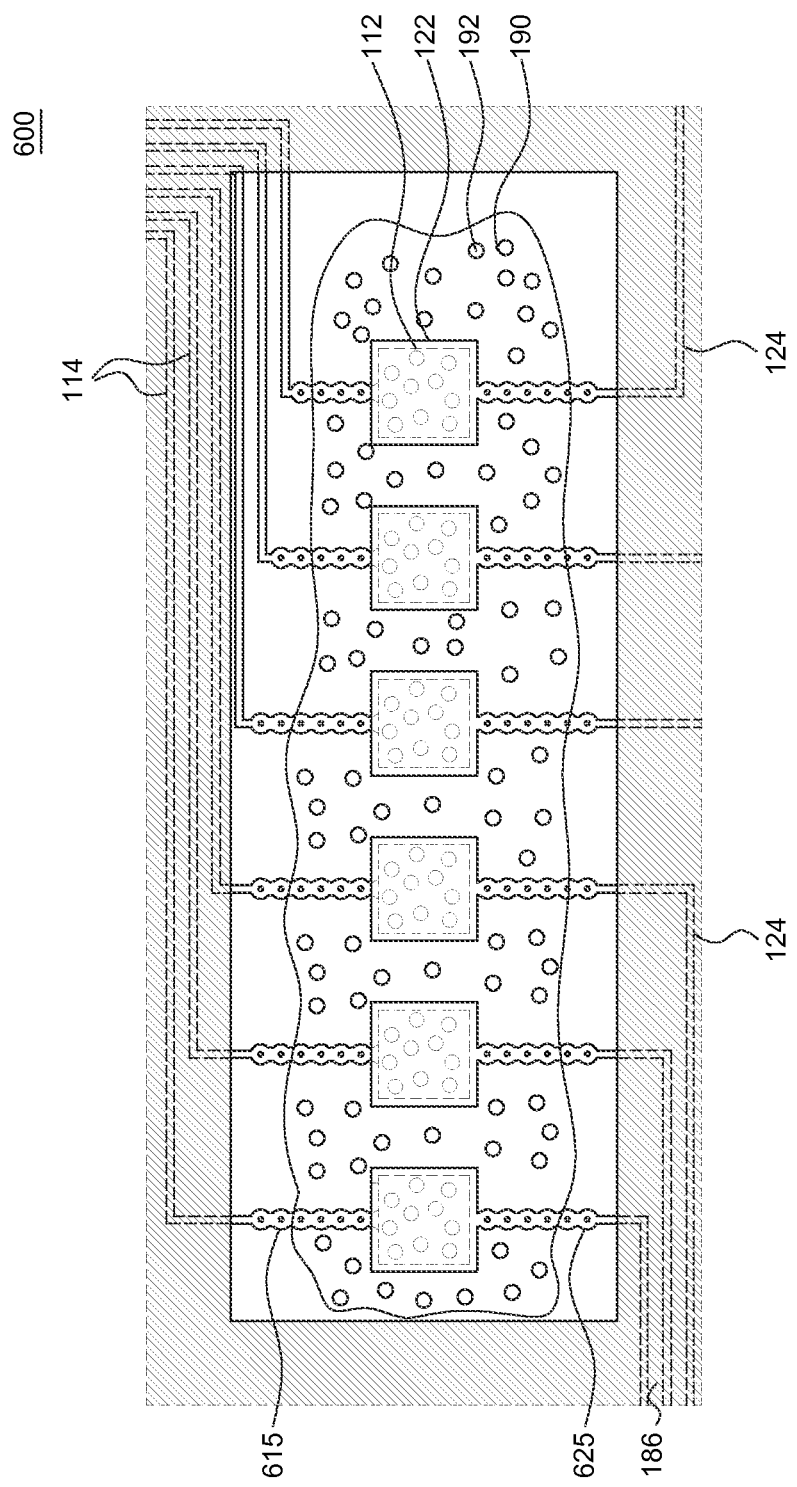

Hereinafter, a flexible organic light emitting display device according to still another exemplary embodiment of the present disclosure will be described with reference to FIG. 6. The first touch line unit 114 and the second touch line unit 124 formed on a pad unit of a flexible organic light emitting display device 600 are respectively configured to include a first auxiliary touch line unit 615 and a second auxiliary touch line unit 625 each has a rounded shape or a wavy shape. According to this configuration, if the pad unit is bent, a stress applied to the line units is reduced, if a portion of the line is cut or broken caused by the plurality of conductive balls 192, connection can be made by the other portion of the line and, thus, durability to repeated bending is improved even if the diameter of the conductive ball 192 is larger than the width of any one of the touch line units.

The flexible organic light emitting display device 600 according to still another exemplary embodiment of the present disclosure is the same as the flexible organic light emitting display device 100 according to an exemplary embodiment of the present disclosure except the above-described part. Thus, redundant descriptions thereof will be omitted.

Meanwhile, although not illustrated in FIG. 2 to FIG. 6, a first auxiliary touch line unit and a second auxiliary touch line unit may be formed on a curved surface (e.g., curved display device).

Figure 7:
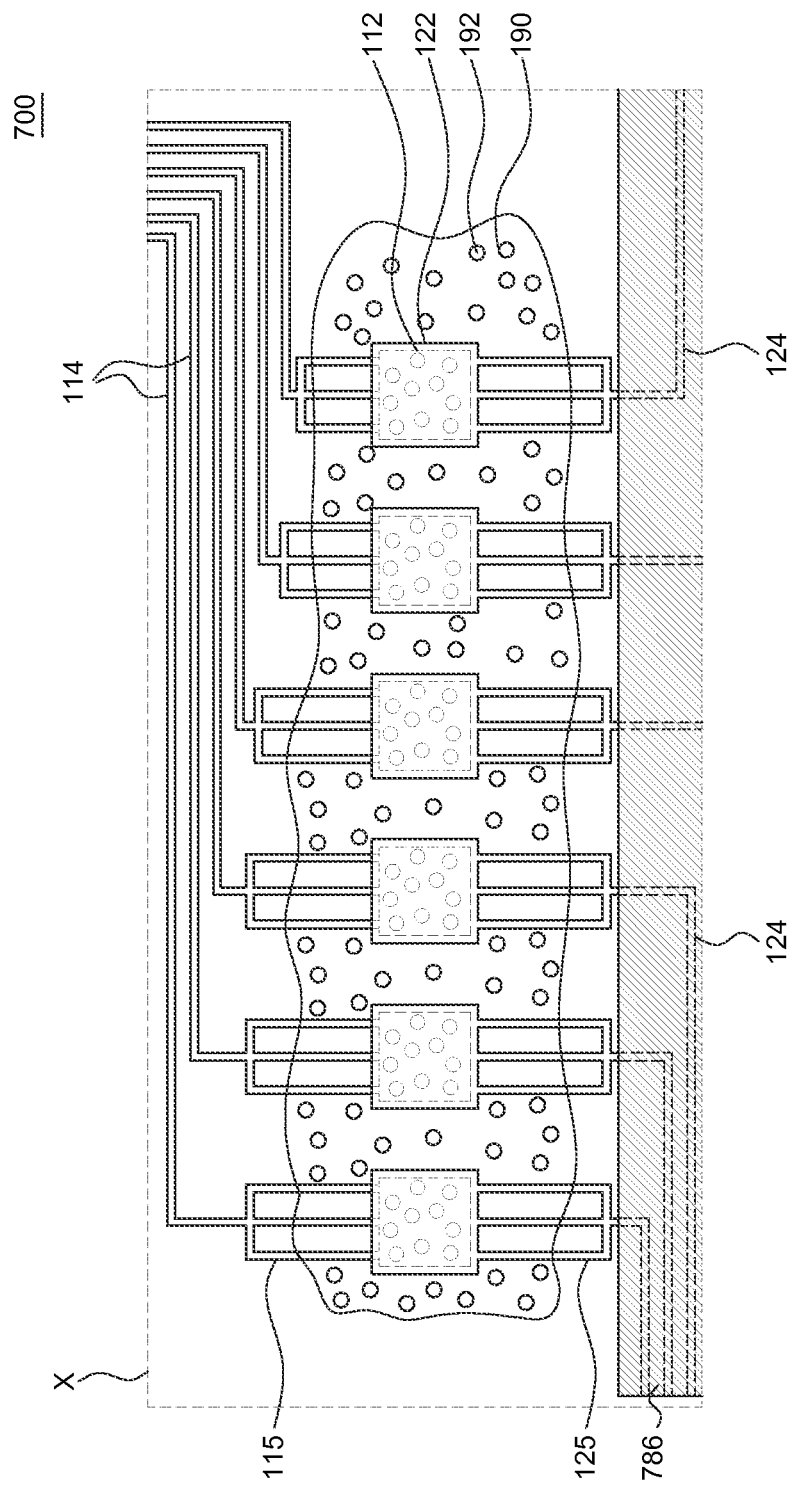

Hereinafter, a flexible organic light emitting display device according to still another exemplary embodiment of the present disclosure will be described with reference to FIG. 7. In a flexible organic light emitting display device 700, a transparent adhesive layer 786 is formed along one side of a pad unit. That is, the transparent adhesive layer 786 may be formed along a lower side of the pad unit as illustrated in FIG. 7, but is not limited thereto. The transparent adhesive layer 786 may be formed along at least one side of the pad unit so as to correspond to a plurality of sides of the pad unit.

The flexible organic light emitting display device 700 according to still another exemplary embodiment of the present disclosure is the same as the flexible organic light emitting display device 100 according to an exemplary embodiment of the present disclosure except the above-described part. Thus, redundant descriptions thereof will be omitted.

Figure 8:
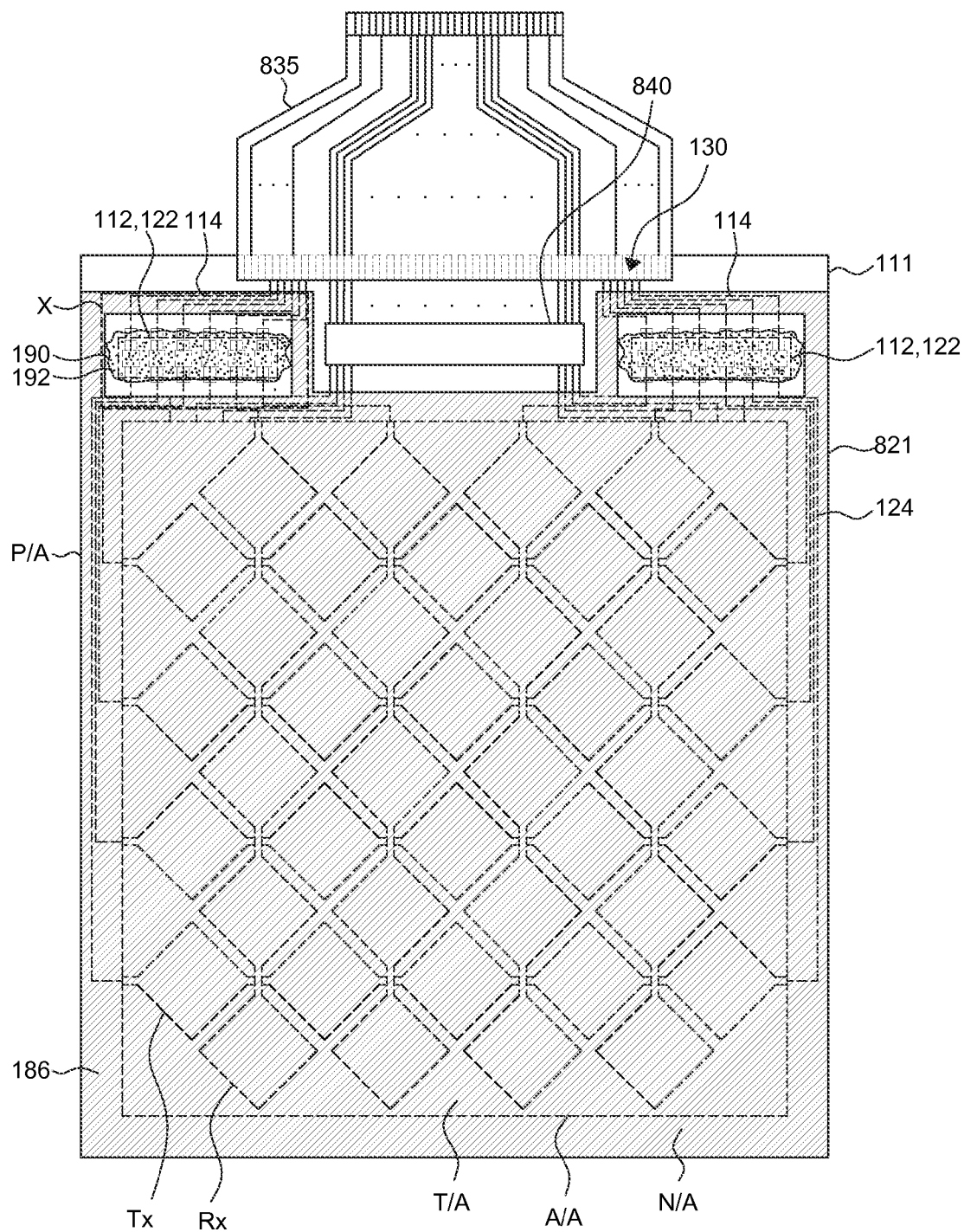
FIG. 8 is a schematic plan view of a flexible organic light emitting display device according to still another exemplary embodiment of the present disclosure.

Hereinafter, a flexible organic light emitting display device according to still another exemplary embodiment of the present disclosure will be described with reference to FIG. 8. In a flexible organic light emitting display device 800, a driving circuit unit 840 is disposed on a first flexible substrate 111. Herein, an area for a second flexible substrate 821 overlapped with an area where the driving circuit unit 840 is mounted is configured to be cut out or the driving circuit unit 840 positioned on the first flexible substrate 111 is configured to be non-overlapped with the second flexible substrate 821. According to this configuration, even if the driving circuit unit 840 is mounted on the first flexible substrate 111, the driving circuit unit 840 can be disposed without extending an additional space on the first flexible substrate 111. Further, since the driving circuit unit 840 is not disposed on a connection part 835, the connection part 835 can be easily bent.

The flexible organic light emitting display device 800 according to still another exemplary embodiment of the present disclosure is the same as the flexible organic light emitting display device 100 according to an exemplary embodiment of the present disclosure except the above-described part. Thus, redundant descriptions thereof will be omitted.

The exemplary embodiments of the present disclosure can also be described as follows:

A flexible organic light emitting display device comprises a first flexible substrate and a second flexible substrate spaced apart from the first flexible substrate, the first flexible substrate and the second flexible substrate configured to have a first gap at a display area and a second gap at a peripheral area surrounding the display area, a first touch line unit connected with a first pad unit on the first flexible substrate at the peripheral area, a second touch line unit connected with a second pad unit on the second flexible substrate at the peripheral area; and a gap balancing conductive element included in a conductive adhesive layer configured to electrically connect the first pad unit and the second pad unit for maintaining the second gap on the basis of the first gap.

The flexible organic light emitting display device may further comprises a transparent adhesive layer between the first flexible substrate and the second flexible substrate with a thickness corresponding to the diameter of the conductive ball at the peripheral area.

A difference between the first gap and the second gap may be less than 10%.

The first gap may be equivalent to the second gap and the gap balancing conductive element may have one or more shapes among a ball, a column, a hexagon, a rounded shape or combinations thereof.

The flexible organic light emitting display device may further comprise a plurality of thin-film transistors on the first substrate at the display area, an organic light emitting element including a first electrode on the plurality of the thin-film transistors, an organic light emission layer on the first electrode and a second electrode on the organic light emission layer, a transparent flexible encapsulation unit on the organic light emitting element, and a touch electrode unit on the second flexible substrate at a touch area, The touch electrode unit and the second electrode may be defined to have a third gap therebetween, which is determined in consideration of bendability of the flexible organic light emitting display device and a parasitic capacitance formed between the second electrode and the touch electrode unit.

The third gap may be from 4 μm to 13 μm.

The transparent adhesive layer may be formed along at least one side of the first pad unit and the second pad unit.

The transparent adhesive layer may be configured to surround the first pad unit and the second pad unit.

The first touch line unit may be configured to include a first auxiliary touch line unit and the second touch line unit is configured to include a second auxiliary touch line unit.

The first auxiliary touch line unit may include a plurality of first lines separated in parallel with each other, each of the first lines are connected to the first pad unit and the first touch line unit and the second auxiliary touch line unit may include a plurality of second lines separated in parallel with each other, each of the second line are connected to the second pad unit and the second touch line unit.

The diameter of the conductive ball may be larger than a width of the first lines of the first auxiliary touch line unit and a width of the second lines of the second auxiliary touch line unit.

The first auxiliary touch line unit and the second auxiliary touch line unit include one or more shapes among a zigzag shape, a diamond shape, a rounded shape and a wavy shape, or combinations thereof.

The flexible organic light emitting display device may further comprise a driving circuit unit connected to the first touch line unit and configured to be positioned on the first flexible substrate at a bendable area.

The driving circuit unit may be configured to be non-overlapped with the second flexible substrate.

An area for the second flexible substrate, overlapped with an area where the driving circuit unit is mounted, may be configured to be cut out.

The present disclosure has an effect of reducing physical stress generated in a pad unit and also improving the ability of the pad unit to bend or flex by forming a diameter of a conductive ball. The conductive ball is for connecting a first flexible substrate and a second flexible substrate. The diameter of the conductive ball is determined on the basis of the total thickness of other various elements configuring a flexible organic light emitting display device.

Further, the present disclosure has an effect of reducing physical stress generated at the pad unit by forming a transparent adhesive layer having a thickness near the pad unit. The thickness corresponds to the total thickness of other various elements configuring the flexible organic light emitting display device. The stress can also be reduced by forming the transparent adhesive layer to seal the pad unit.

Furthermore, the present disclosure has an effect of reducing a frequency of a line break caused by the conductive ball during a bonding process using the conductive ball for a mass production. The reduction of the frequency of line break is achieved by forming a line unit adjacent to the pad unit to have a specific shape.

It will be apparent to those skilled in the art that various modifications and variations can be made in the flexible organic light emitting display device of the present invention without departing from the spirit or scope of the invention. Thus, it is intended that the present invention cover the modifications and variations of this invention provided they come within the scope of the appended claims and their equivalents.

What is claimed is:

1. A flexible organic light emitting display device, comprising:
a first flexible substrate and a second flexible substrate spaced apart from the first flexible substrate, the first flexible substrate and the second flexible substrate configured to have a first gap at a display area and a second gap at a peripheral area surrounding the display area;
a first touch line unit connected with a first pad unit on the first flexible substrate at the peripheral area;
a second touch line unit connected with a second pad unit on the second flexible substrate at the peripheral area; and
a gap balancing conductive element included in a conductive adhesive layer configured to electrically connect the first pad unit and the second pad unit and for maintaining the second gap on the basis of the first gap,
wherein in an area coated with the conductive adhesive layer including the a gap balancing conductive element, the first touch line includes a first auxiliary touch line unit that includes a plurality of first lines, and the second touch line includes a second auxiliary touch line unit that includes a plurality of second lines,
wherein each of the first lines of the first auxiliary touch line unit are connected to the first pad unit and to the first touch line, and
wherein each of the second lines of the second auxiliary touch line unit are connected to the second pad unit and to the second touch line.

2. The flexible organic light emitting display device according to claim 1, further comprising:
a transparent adhesive layer between the first flexible substrate and the second flexible substrate with a thickness corresponding to the dimensions of the gap balancing conductive element at the peripheral area.

3. The flexible organic light emitting display device according to claim 2, wherein a difference between the first gap and the second gap is less than 10%.

4. The flexible organic light emitting display device according to claim 3,
wherein the first gap is equivalent to the second gap,
wherein the gap balancing conductive element has one or mere shapes among a ball, a column, a hexagon, a rounded shape or combinations thereof.

5. The flexible organic light emitting display device according to claim 4, wherein the transparent adhesive layer is formed along at least one side of the first pad unit and the second pad unit.

6. The flexible organic light emitting display device according to claim 5, wherein the transparent adhesive layer is configured to surround the first pad unit and the second pad unit.

7. The flexible organic light emitting display device according to claim 4, further comprising:
a driving circuit unit connected to the first touch line unit and configured to be positioned on the first flexible substrate at a bendable area.

8. The flexible organic light emitting display device according to claim 7, wherein the driving circuit unit is configured to be non-overlapped with the second flexible substrate.

9. The flexible organic light emitting display device according to claim 8, wherein an area for the second flexible substrate, overlapped with an area where the driving circuit unit is mounted, is configured to be cur out.

10. The flexible organic light emitting display device according to claim 2, further comprising:
a plurality of thin-film transistors on the first flexible substrate at the display area;
an organic light emitting element including a first electrode on the plurality of the thin-film transistors, an organic light emission layer on the first electrode and a second electrode on the organic light emission layer;
a transparent flexible encapsulation unit on the organic light emitting element; and
a touch electrode unit on the second flexible substrate at a touch area,
wherein the touch electrode unit and the second electrode are defined to have a third gap therebetween, which is determined in consideration of bendability of the flexible organic light emitting display device and a parasitic capacitance formed between the second electrode and the touch electrode unit.

11. The flexible organic light emitting display device according to claim 10, wherein the third gap is from 4 μm to 13 μm.

12. The flexible organic light emitting display device according to claim 1, wherein the dimensions of the gap balancing conductive element is larger than a width of the first lines of the first auxiliary touch line unit and a width of the second lines of the second auxiliary touch line unit.

13. The flexible organic light emitting display device according to claim 1, wherein the first auxiliary touch line unit and the second auxiliary touch line unit include one shape among a zigzag shape, a diamond shape, a rounded shape and a wavy shape, or combinations thereof.

14. A method for producing a flexible organic light emitting display device comprising the steps:
providing a first flexible substrate having a first touch line unit connected with a first pad unit on the first flexible substrate at the peripheral area;
providing a second flexible substrate having a second touch line unit connected with a second pad unit on the second flexible substrate at the peripheral area;
bonding the first flexible substrate to the second flexible substrate using a conductive adhesive layer, wherein a gap balancing conductive element is included in the conductive adhesive layer to electrically connect the first pad unit and the second pad unit,
wherein in an area coated with the conductive adhesive layer including the a gap balancing conductive element, the first touch line includes a first auxiliary touch line unit that includes a plurality of first lines, and the second touch line includes a second auxiliary touch line unit that includes a plurality of second lines,
wherein each of the first lines of the first auxiliary touch line unit are connected to the first pad unit and to the first touch line,
wherein each of the second lines of the second auxiliary touch line unit are connected to the second pad unit and to the second touch line, and
wherein the first flexible substrate and the second flexible substrate have a first gap at a display area and a second gap at a peripheral area surrounding the display area.

* * * * *